United States Patent [19]

Buley et al.

[11] Patent Number: 5,464,031
[45] Date of Patent: Nov. 7, 1995

[54] METHOD OF CHAMBER CLEANING IN MOCVD APPLICATIONS

[75] Inventors: Todd W. Buley; Gurtej S. Sandhu, both of Boise, Id.

[73] Assignee: Micron Semiconductor, Inc., Boise, Id.

[21] Appl. No.: 81,735

[22] Filed: Jun. 22, 1993

[51] Int. Cl.$^6$ .......................................... B08B 3/00
[52] U.S. Cl. .................... 134/1; 134/30; 134/31
[58] Field of Search .................... 134/1, 26, 30, 134/31; 156/643

[56] References Cited

U.S. PATENT DOCUMENTS

| | | | |
|---|---|---|---|
| 5,204,314 | 4/1993 | Kirlin et al. | 505/1 |
| 5,207,836 | 5/1993 | Chang | 134/1 |
| 5,252,518 | 10/1993 | Sandhu et al. | 437/200 |
| 5,281,302 | 1/1994 | Gabric et al. | 134/1 |
| 5,286,301 | 2/1994 | Albrecht | 134/1 |
| 5,362,328 | 11/1994 | Gardiner et al. | 118/726 |

*Primary Examiner*—Scott Kastler
*Attorney, Agent, or Firm*—Susan B. Collier

[57] ABSTRACT

The invention is a process for cleaning a chamber after a chemical vapor deposition has been performed therein. A residue formed during the deposition is combined with a reactive species to form a gas containing an organic substance once found in the residue and to form a film on the chamber walls and internal parts. The gas and the film are removed from the chamber. The formation of a polymer byproduct on the chamber walls and other internal parts of the chamber is minimized by the method of the invention.

6 Claims, No Drawings

METHOD OF CHAMBER CLEANING IN MOCVD APPLICATIONS

FIELD OF THE INVENTION

The invention relates to semiconductor fabrication processes, and more particularly to a method for cleaning a chamber used during a metal oxide chemical vapor deposition.

BACKGROUND OF THE INVENTION

Highly conformal titanium nitride (TiN) films can be obtained using a low temperature metal organic chemical vapor deposition (MOCVD). MOCVD is well known to those skilled in the art. The MOCVD produces a tetrakis dimethyl amino titanium (TDMAT) residue on the chamber walls and other internal parts, such as shower heads, that must be removed following the MOCVD of TiN. The chamber is typically cleaned with NF3 plasma after the TiN film has been formed. Due to the hydrocarbons inherent in the TDMAT residue repeated cleaning with NF3 plasma creates a polymer byproduct which builds up on the chamber walls and other internal parts. The creation of the polymer byproduct results during the fluorination of hydrocarbons in the TDMAT. It is difficult to remove the polymer byproduct from the chamber walls and shower heads.

OBJECTS OF THE INVENTION

An object of the invention is minimizing of polymer build up on chamber walls and other internal parts.

SUMMARY OF THE INVENTION

The invention is a process which minimizes byproduct formation on the walls of a work chamber during chamber cleaning. The process alters the chemical make up of a residue produced during a fabrication process. A reactive species is injected into the chamber. The reactive species reacts with the residue to form a gas and a film. The gas contains an organic substance formerly found in the residue. The gas is removed form the chamber, thereby decreasing the amount of organic substance found in the chamber. The film is easily removed from the chamber using a plasma etch. Since the amount of organic substance has been reduced the formation of undesired byproducts on the chamber walls and other internal parts during the plasma etch is minimized.

DETAILED DESCRIPTION OF THE INVENTION

In a preferred embodiment the invention provides a process which prevents a polymer build up on chamber walls and other internal parts, such as shower heads, during the removal of a tetrakis dimethyl amino titanium (TDMAT) residue formed thereon during a metal organic chemical vapor deposition (MOCVD) process.

The method of the invention is preceded by a MOCVD of TiN. The MOCVD uses a metal organic precursor diluted by a gas such as N2, or Ar. A TDMAT residue is formed on the chamber walls and other internal parts during the MOCVD of the TiN.

Following the MOCVD the chamber is flooded with a reactive species, in this case ammonia. TDMAT and ammonia are highly reactive. A gaseous methylamine radical which is present in the TiN is replaced by N from the ammonia. The gaseous methylamine radical, which contains much of the organic substances, such as carbons or hydrocarbons, originally present in the TDMAT, is then pumped from the chamber.

During the reaction the ammonia converts the TDMAT residue on the chamber walls to a film of TiCxNy at temperatures as low as room temperature. The carbon content of the TiCxNy film is less than 1 C per Ti atom, half of which is bonded to Ti. In comparison, a molecule of TDMAT contains 8 carbon atoms and 1 Ti atom. There is even a higher number of carbon atoms in a molecule of tetrakis diethyl amino titanium (TDEAT) or other compounds formed during MOCVD. Thus the process has reduced the number of carbon atoms in the TiCxNy film now present on the chamber walls and other internal parts from the number of carbon atoms present in the TDMAT residue formerly present on the chamber walls and other internal parts.

Since the TiCxNy film has less carbon molecules than the TDMAT residue, the film can be removed with a NF3 plasma clean without producing as much polymer byproduct. During the plasma clean, NF3 plasma is introduced into the chamber. The plasma etches the TiCxNy from the walls and other internal parts, and the NF3 plasma and the TiCxNy and is then pumped from the chamber. A typical plasma clean is performed with 150 sccm of NF3 flow to maintain 0.5 Torr pressure and at 150 W of r.f. plasma.

Although the invention has been described in terms of a chamber cleaning process performed subsequent to a MOCVD, the method has utility where a residue must be removed from a chamber without producing a byproduct. Accordingly the invention should be read as limited only by the claims.

What is claimed is:

1. A method for removing tetrakis dimethyl amino titanium from a work chamber, comprising the following steps:
   a) flooding said chamber with ammonia;
   b) combining the tetrakis dimethyl amino titanium and said ammonia;
   c) forming a TiCxNy film with said ammonia and said tetrakis dimethyl amino titanium;
   d) releasing a gas radical having an organic substance from said tetrakis dimethyl amino titanium;
   e) removing said gas from said chamber;
   f) introducing a plasma into said chamber;
   g) etching said TiCxNy with said plasma; and
   h) removing said TiCxNy and said plasma from said chamber.

2. A method for performing a chemical vapor deposition to produce a film overlying a semiconductor structure, comprising the following steps:
   a) positioning the structure in a chamber;
   b) injecting a metal organic precursor into the chamber;
   c) depositing the film overlying the structure;
   d) creating a first residue containing an organic substance in the chamber;
   e) removing the structure from the chamber;
   f) injecting ammonia into the chamber, said ammonia capable of chemically combining with said first residue to create a second residue containing less of said organic substance than said first residue; and
   g) removing said second residue from the chamber.

3. A method for performing a chemical vapor deposition to produce a film overlying a semiconductor structure, comprising the following steps:

a) positioning the structure in a chamber;

b) injecting a metal organic precursor into the chamber;

c) depositing the film overlying the structure;

d) forming a first residue containing an organic substance in the chamber;

e) removing the structure from the chamber;

f) injecting a reactive species into the chamber, said reactive species capable of chemically combining with said first residue to create a second residue which contains less of said organic substance than said first residue; and g) removing said second residue from the chamber.

4. A cleaning method for cleaning a chamber, comprising the following steps:

a) depositing a deposition film on a semiconductor structure in the chamber using chemical vapor deposition;

b) forming a compound containing an organic substance during said step of depositing on an internal part of the chamber;

c) removing the structure from the chamber;

d) injecting a reactive species into the chamber;

e) reacting the reactive species and the compound one with the other to form a gas containing the organic substance in the chamber and to form a residue film containing the organic substance on the internal part of the chamber;

f) removing the gas containing the organic substance from the chamber;

g) creating a plasma in the chamber;

h) reacting the plasma and the residue film one with the other; and i) removing the residue film from the internal part of the chamber.

5. A method for removing a residue having an organic substance from a chamber in which the residue was created during a chemical vapor deposition, comprising:

a) flooding the chamber with a reactive species;

b) combining the residue with the reactive species;

c) forming a film on an internal part of the chamber in response to said step of combining;

d) releasing a gas radical during said step of forming, said gas radical having an organic substance;

e) removing the gas radical from the chamber;

f) introducing plasma into the chamber;

g) etching the film from the internal part of the chamber with said plasma to create a second residue; and h) removing said second residue from the chamber.

6. A method for reducing the formation of a non-removable byproduct during the cleaning of a residue from a work chamber, comprising he following steps:

a) introducing a reactive species into the chamber;

b) forming a gas and a film with said reactive species and said residue, said gas and said film containing an organic substance formerly found in said residue;

c) removing said gas from the chamber;

d) introducing a plasma into the chamber; and e) combing said plasma and said film to form an altered residue having said organic substance.

* * * * *